US009104816B2

(12) United States Patent
Lee

(10) Patent No.: US 9,104,816 B2
(45) Date of Patent: Aug. 11, 2015

(54) MEMORY CARD HAVING PLURALITY OF INTERFACE PORTS, MEMORY CARD SYSTEM, AND DATA COMMUNICATION METHOD FOR THE MEMORY CARD

(75) Inventor: Kee-hoon Lee, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1893 days.

(21) Appl. No.: 12/020,596

(22) Filed: Jan. 28, 2008

(65) Prior Publication Data
US 2008/0228973 A1 Sep. 18, 2008

(30) Foreign Application Priority Data

Jan. 26, 2007 (KR) .................. 10-2007-0008613

(51) Int. Cl.
G06F 3/00 (2006.01)
G06F 13/00 (2006.01)
G06F 13/38 (2006.01)
G06K 7/10 (2006.01)
G06K 19/07 (2006.01)
G06K 19/077 (2006.01)
G11C 7/10 (2006.01)
G06F 5/00 (2006.01)
G06F 13/28 (2006.01)
G06F 13/42 (2006.01)

(52) U.S. Cl.
CPC .......... G06F 13/385 (2013.01); G06K 7/10297 (2013.01); G06K 19/07 (2013.01); G06K 19/07732 (2013.01); G11C 7/1075 (2013.01); Y02B 60/1228 (2013.01); Y02B 60/1235 (2013.01)

(58) Field of Classification Search
CPC ............. G06F 3/00; G06F 5/00; G06F 13/00; G06F 13/28; G06F 13/42
USPC .......................... 710/11, 38, 62, 105; 711/115
See application file for complete search history.

(56) References Cited

U.S. PATENT DOCUMENTS

| 5,790,775 | A  | * | 8/1998  | Marks et al. ................. 714/9 |
| 6,385,677 | B1 | * | 5/2002  | Yao ............................ 711/115 |
| 6,857,038 | B2 | * | 2/2005  | Liu et al. ................... 710/301 |
| 7,055,056 | B2 | * | 5/2006  | Bessire ........................ 714/6 |
| 7,055,061 | B2 | * | 5/2006  | Nitta ........................... 714/13 |
| 7,114,015 | B2 | * | 9/2006  | Alva et al. .................... 710/38 |
| 7,257,660 | B2 | * | 8/2007  | Chang et al. ............... 710/301 |
| 7,308,604 | B2 | * | 12/2007 | McDonnell et al. ............ 714/9 |
| 7,409,477 | B2 | * | 8/2008  | Wyatt et al. .................. 710/62 |
| 7,441,708 | B2 | * | 10/2008 | Schade ....................... 235/486 |
| 7,480,831 | B2 | * | 1/2009  | McAfee et al. ............... 714/43 |
| 7,543,085 | B2 | * | 6/2009  | Beckett et al. ............... 710/11 |
| 2003/0090953 | A1 | * | 5/2003 | Kawai et al. ................ 365/233 |
| 2003/0100203 | A1 | * | 5/2003 | Yen .............................. 439/79 |
| 2004/0059846 | A1 | * | 3/2004 | Liu et al. ...................... 710/62 |
| 2006/0047860 | A1 | * | 3/2006 | Lin .............................. 710/11 |
| 2007/0055823 | A1 | * | 3/2007 | Jo et al. ...................... 711/115 |

FOREIGN PATENT DOCUMENTS

| JP | 2006048369 A | 2/2006 |
| KR | 1020060042366 A | 5/2006 |
| KR | 1020060081703 A | 7/2006 |

* cited by examiner

Primary Examiner — Ryan Stiglic
Assistant Examiner — Christopher a Daley
(74) Attorney, Agent, or Firm — Volentine & Whitt, PLLC

(57) ABSTRACT

A memory card is disclosed including first and second host interfaces facilitating the communication of data between the memory card and a host using, respectively, first and second protocols, wherein the first protocol defines low-speed operations and the second protocol defines high-speed operations for the memory card. The second host interface is only enabled in response to an indication by the host device of a high-speed memory card operation.

7 Claims, 6 Drawing Sheets

MEMORY CARD HAVING PLURALITY OF INTERFACE PORTS, MEMORY CARD SYSTEM, AND DATA COMMUNICATION METHOD FOR THE MEMORY CARD

CROSS-REFERENCE TO RELATED PATENT APPLICATION

This application claims the benefit of Korean Patent Application No. 10-2007-0008613, filed on Jan. 26, 2007, the subject matter of which is hereby incorporated by reference.

BACKGROUND OF THE INVENTION

1. Field of the Invention

The present invention relates generally to memory cards, systems using memory cards, and an interface method for memory cards. More particularly, the invention relates to a memory card having a separate interface port for transmitting/receiving data at high speed, as well as systems and an interface method associated with such a memory card.

2. Description of the Related Art

Memory cards are portable tokens including a card controller (e.g., a central processing unit (CPU)) and a memory unit capable of storing data received from a host device or data terminal. Contemporary memory cards use memory unit(s) including flash memory. The card controller interfaces with a host device and controls read/write operations that retrieve and store, respectively, data from the memory unit in accordance with command(s) provided by the host. Card controllers often have the capability of executing various applications that implement read, write, erase, data identification, system resource configuration, data security, and other operations associated with the communication of data to/from the memory unit.

Several emerging business models are predicated upon the transfer of "digital content" to a memory card. For example, video clips, audio files, movies, and other voluminous information files may be transferred to a memory card from a vending Kiosk using automated systems. That is, a user may insert his memory card into an automated Kiosk and use an information transmission system including a simple graphical user interface to download selected digital content to his memory card. Such business models offer ease of use, low cost convenience, and improved security as compared with open transmission media such as wireless or the Internet.

Given its voluminous nature, the speed with which the digital content may be downloaded to the memory card is crucial to the success of the business models. Conventional memory cards are configured to transmit voluminous data bi-directionally (read and written) by sharing a common bus instead of uni-directionally via separate buses.

Figure (FIG.) 1 illustrates the structure of a conventional memory card 10. Referring to FIG. 1, conventional memory card 10 includes an interface port for data communications with a host. The interface port is typically implemented through at least one pad 11. The interface port allows memory card 10 to receive a power voltage VDD, a ground voltage VSS, various command signal(s) CMD, a clock signal CLK, and a data DATA. Memory card 10 is also able to communicate data to a host device via the single interface port.

In many applications, a memory card is used in conjunction with a battery powered mobile device. Such applications have traditionally restricted the ability of the memory card to download large volume digital content, because high-speed data communications result in significant consumption of battery power. Additionally, the use of a single interface port facilitating bi-directional data transmissions between the memory card and host places significant practical limitations on the speed with which digital content may be downloaded. The foregoing limitations on the speed with which digital content may be downloaded adversely effects the profitability of the emerging business models.

SUMMARY OF THE INVENTION

Embodiments of the invention provide a memory card capable of communicating data at high speed without consuming an unacceptable high level of battery power. Embodiments of the invention also provide a memory card system, and a data transmission method for such a memory card.

In one embodiment, the invention provides a memory card comprising; first and second host interfaces facilitating the communication of data between the memory card and a host using, respectively, first and second protocols, wherein the first protocol defines low-speed operations and the second protocol defines high-speed operations for the memory card, a memory unit storing data, a memory controller controlling memory unit operations in accordance with a set of commands received from the host, and generating a control signal in response to at least one command in the set of commands indicating a high-speed operation, and an enable control unit enabling operation of the second host interface in response to the control signal.

In another embodiment, the invention provides a memory card comprising; a first communication port facilitating connection between a host and a first host interface, the first host interface facilitating communication of data between the memory card and a host using a first protocol, a second communication port facilitating connection between the host and a second host interface, the second host interface facilitating communication of data between the memory card and the host using a second protocol, a memory unit storing data, a power sensing unit sensing application of a power signal to the second host interface via the second communication port and generating a control signal in response to the sensed power signal, and an enable control unit enabling operation of the second host interface in response to the control signal.

In another embodiment, the invention provides a memory card comprising; a first communication port facilitating connection between a host and a first host interface, wherein the first host interface facilitates normal operations communicating data between the memory card and a host using a first protocol, a second communication port facilitating connection between the host and a second host interface, wherein the second host interface facilitates high-speed operations communicating data between the memory card and the host using a second protocol, wherein the second host interface is only enabled in response to an indication by the host that a high-speed operation is required.

BRIEF DESCRIPTION OF THE DRAWINGS

Embodiment of the invention will be described with reference to the attached drawings in which.

DESCRIPTION OF EMBODIMENTS

Figure 1:
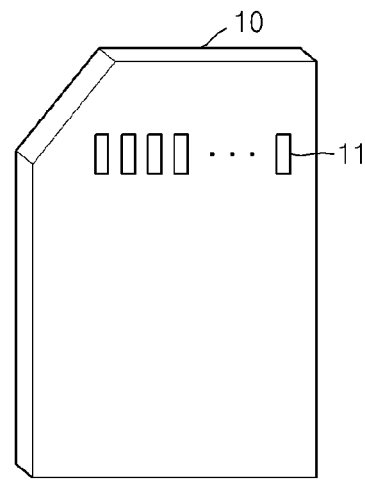
FIG. 1 illustrates the structure of a conventional memory card.

Embodiments of the invention are described in some additional detail with reference to the accompanying drawings. Throughout the drawings and written description, like reference numerals will be used to denote like or similar elements.

Figure 2:
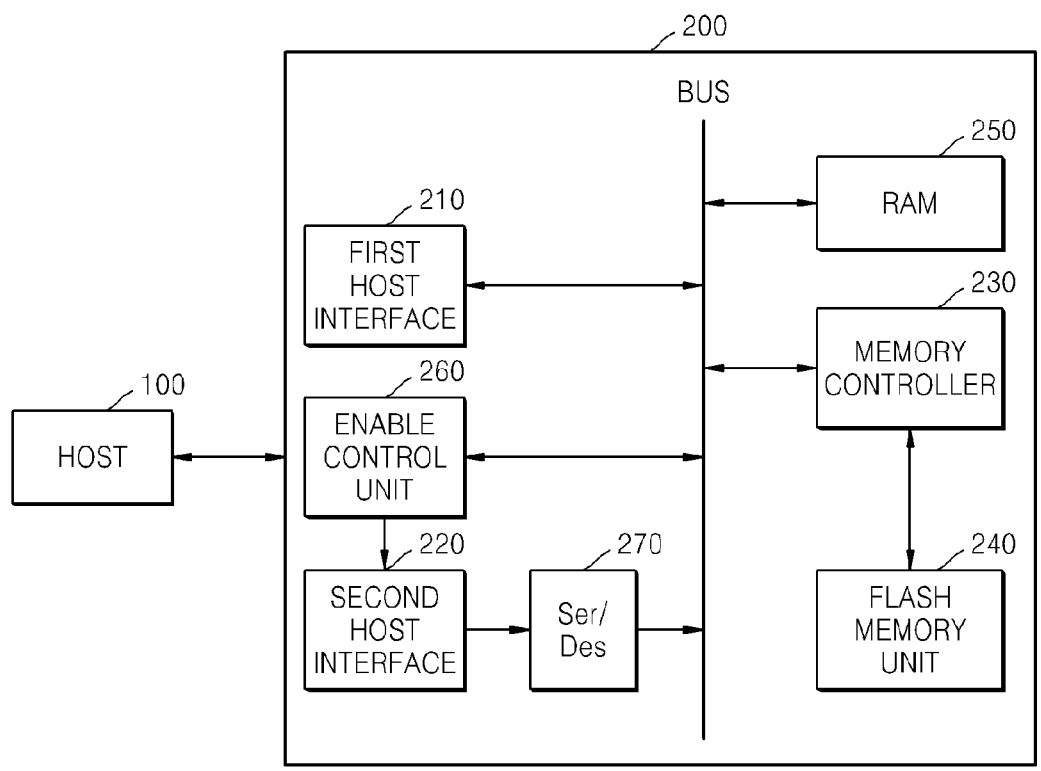
FIG. 2 is a block diagram of a memory card according to an exemplary embodiment of the present invention.

FIG. 2 is a block diagram of a memory card 200 according to an embodiment of the invention. Memory card 200 includes a plurality of host interfaces (210, 220) transmitting data to and receiving data from a host 100.

A first host interface 210 performs data communication with host 100 using a (first) low-speed data transmission protocol which consumes relatively less power. For example, first host interface 210 may operate in conjunction with a plurality of data input/output (I/O) ports (not shown) that connect memory card 200 with host 100 via parallel data communication paths that facilitate bi-directional data transfers. First host interface 210 may be advantageously configured and operated to facilitate general memory card operations, such as a playback operation for digital contents stored in memory card 200.

A second host interface 220 is also included in memory card 200. However, second host interface 220 performs data communication with host 100 using a (second) high-speed data transmission protocol. Owing to such a configuration, second host interface 220 may be used during the download or upload of voluminous files of digital content. For example, second host interface 220 may be used in conjunction with a protocol that facilitates high-speed unidirectional data communication. Since data communication using second host interface 220 is not favorable in terms of power consumption, second host interface 220 will typically be disabled during general memory card operations and will only be enabled during selected "high-speed" operations, such as downloading of voluminous files.

In the illustrated example of FIG. 2, memory card 200 also includes a memory controller 230, a flash memory unit 240, and a random access memory (RAM) 250. Signals received via first host interface 210 and second host interface 220 are communicated to these various circuit blocks in memory card 200 by a data bus BUS.

Memory controller 230 controls memory card operations, particularly those used to store, manage and retrieve data from flash memory unit 240 in response to commands received from host 100. RAM 250 may be divided to include program RAM, data RAM, and buffer RAM that temporarily store program(s) and/or data used in the operation of flash memory unit 240.

In order to enable second host interface 220 only during specific high-speed operations, memory card 200 includes an enable control unit 260 controlling the enabled state of second host interface 220. In embodiments wherein a host interface that serially transmits/receives data is added to memory card 200 such that data may be transmitted/received in serial for data processing, memory card 200 may further include a serializer/deserializer (ser/des) 270 for converting parallel data into serial data and/or serial data into parallel data.

In one embodiment, memory card 200 performs data communication with host 100 as follows. Host 100 is assumed to be a device capable of downloading or uploading voluminous files to/from memory card 200 in accordance with designated high-speed operations using a (second) high-speed protocol facilitating high-speed data transmissions.

Once memory card 200 is mounted in host 100, first host interface 210 and second host interface 220 are electrically connected with host 100 through a communication port, which may be conventionally formed on an external face of memory card 200. Memory card 200 then receives command signals CMD from host 100 via a communication port commonly connected to first host interface 210 and second host interface 220. Since first host interface 210 is used for general operations of memory card 200, commands are generally received from host 100 via this common communication port. Thus, in the course of general (non-high-speed) operations, command signals CMD received through first host interface 210 are provided to memory controller 230 for decoding.

However, some decoded commands will indicate a high-speed operation. Control signals and corresponding data derived from such commands may be communicated via the data bus to enable second host interface 220. Thus, second host interface 220 remains disabled during general operations and is enabled only upon receiving a command indicating a high-speed operation. By selectively enabling second host interface 220 in this manner, excessive standby power consumption related to second host interface 220 may be avoided.

In the illustrated example of FIG. 2, a control signal resulting from a decoded command indicating a high-speed operation is communicated from memory controller 230 to enable control unit 260. Enable control unit 260 then facilitate the operative connection of second host interface 220 with host 100. Once second host interface 220 is enabled, host 100 and memory card 200 may conduct high-speed data transfers using a high-speed protocol via the communication port. For example, data may pass from host 100 through the communication port to an enabled second host interface, and from second host interface 220 to the data bus via serializer/deserializer 270.

In this regard, enable control unit 260 may be implemented using a conventional switch or switching circuit that in its ON position applies power to the circuitry implementing second host interface 220. In its OFF position, the switch disconnects second host interface 220 from the power supply, thereby avoiding standby current drain. The ON/OFF actuation of the switch may be controlled by an appropriate control signal received from memory controller 230 in response to various commands received from host 100.

Figure 3:
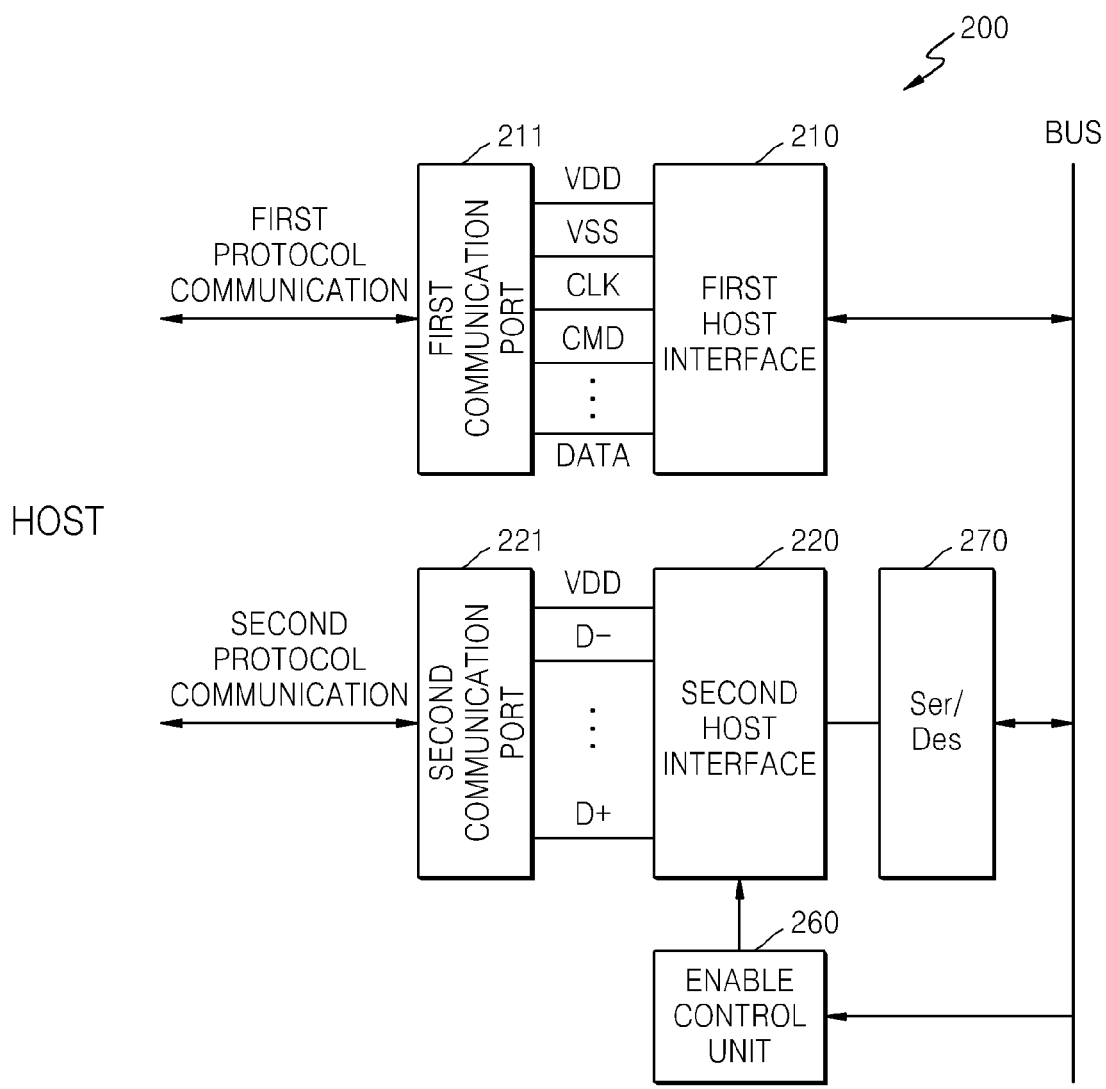
FIG. 3 is a block diagram for illustrating the transmission/reception state of a signal during driving of the memory card illustrated in FIG. 2.

FIG. 3 is a block diagram further illustrating selected aspect of a memory card according to another embodiment of the invention. Memory card 200 of FIG. 3 includes a first communication port 211 and a second communication port 221 each implemented respectively by one or more pins disposed on an external face of memory card 200. Memory card 200 further includes first host interface 210 electrically connected to first communication port 211 in order to transmit/receive information to/from host 100 in accordance with the first protocol, and second host interface 220 electrically connected to second communication port 221 in order to transmit/receive information to/from host 100 in accordance with the second protocol. Memory card 200 may also include enable control unit 260 and serializer/deserializer 270 as described above.

In the illustrated example of FIG. 3, first host interface 210 receives a power voltage VDD, a ground voltage VSS, a clock signal CLK, various command signals CMD, and a data signal DATA from a connected host 100 in accordance with the first protocol via first communication port 211. The first host interface 210 connection with host 100 is made during general memory card operations executed at normal (non-high-speed) speed.

Alternately, host 100 may communicate data to memory card 200 at high-speed using the second protocol when (e.g.,) a voluminous data file needs to be transferred. During such high-speed operations, memory card 200 is connected to host 100 via second host interface 220 and second communication port 221. During high-speed operations host 100 may also be connected to memory card 200 through first communication port 211.

In an embodiment illustrated in FIG. 3, host 100 provides one or more command signal(s) CMD to memory card 200 through first communication port 211. A threshold command signal indicating the high-speed operation to memory card 200 may be used to enable second host interface 200. Once second host interface 220 is enabled, power voltage VDD, ground voltage VSS, and differential data signals D+ and D− may be applied to memory card 200 from host 100 through second communication port 221. Alternately, second host interface 220 may be enabled or disabled in accordance with command signal(s) CMD provided via first communication port 211.

Figure 4A:
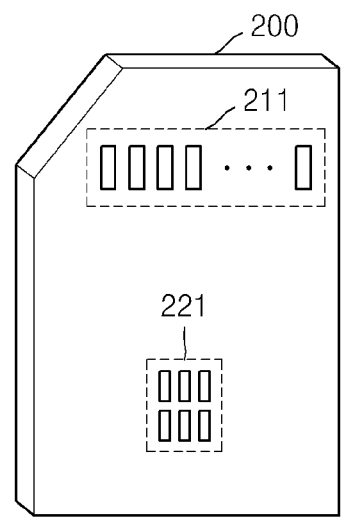
FIGS. 4A and 4B illustrate arrangement of communication ports of a memory card according to an exemplary embodiment of the present invention.
Figure 4B:
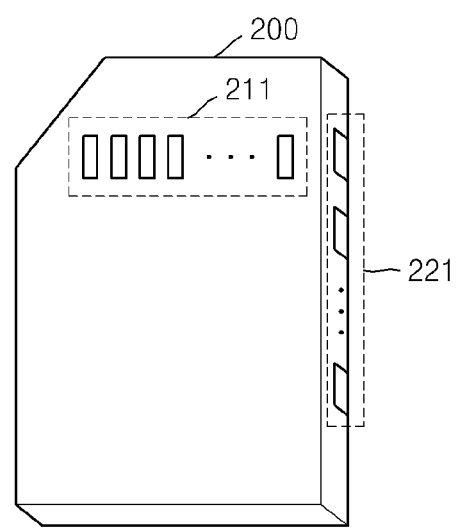

FIGS. 4A and 4B illustrate possible arrangements of communication ports for a memory card according to an embodiment of the invention. In FIG. 4A, first communication port 211 and second communication port 221 are disposed on the same principal face of memory card 200. In FIG. 4B, first communication port 211 and second communication port 221 are disposed on different faces of memory card 200 (e.g., a principal side face and a side face). Although not shown in FIGS. 4A and 4B, first communication port 211 and second communication port 221 may also be disposed on opposite principal faces or opposite edge faces of memory card 200.

In certain embodiments of the invention, it is preferable that second communication port 221 be disposed to minimize the electrical distance between memory controller 230 (or analogous circuits) and second communication port 221 in order to prevent performance degradations caused by noise induced on relatively long transmission lines during high-speed data communications.

Figure 5:
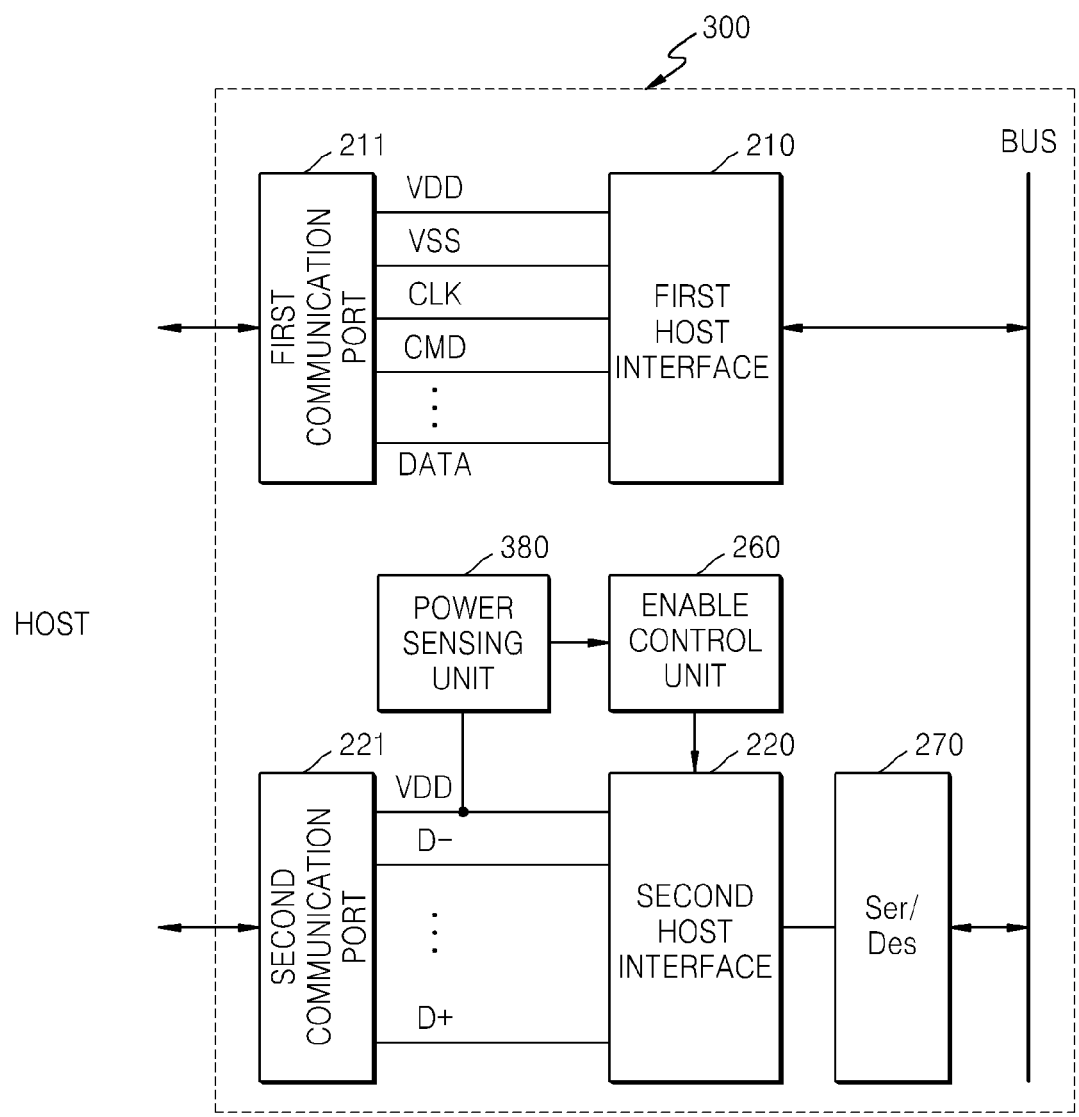
FIG. 5 is a block diagram of a memory card according to another exemplary embodiment of the present invention.

FIG. 5 is a block diagram of a memory card 300 according to another embodiment of the invention.

Referring to FIG. 5, memory card 300 similarly includes first host interface 210 connected via first communication port 211, and second host interface 220 connected via second communication port 221. These components operate in a manner consistent with the foregoing description.

However, when memory card 300 is connected to host 100 via second communication port 221, the application of power signal VDD through second communication port 221 may be detected by a power sensing unit 380. Thus, instead of being enabled by a command signal applied to memory card 300 through first host interface 210, second host interface 220 may be directly enabled by a connected enable control unit 260 responsive to an output from power sensing unit 380. Power sensing unit 380 may be responsive to any applied signal from host 100 though second communication port 221, but in certain embodiment the power voltage VDD is preferred.

Figure 6:
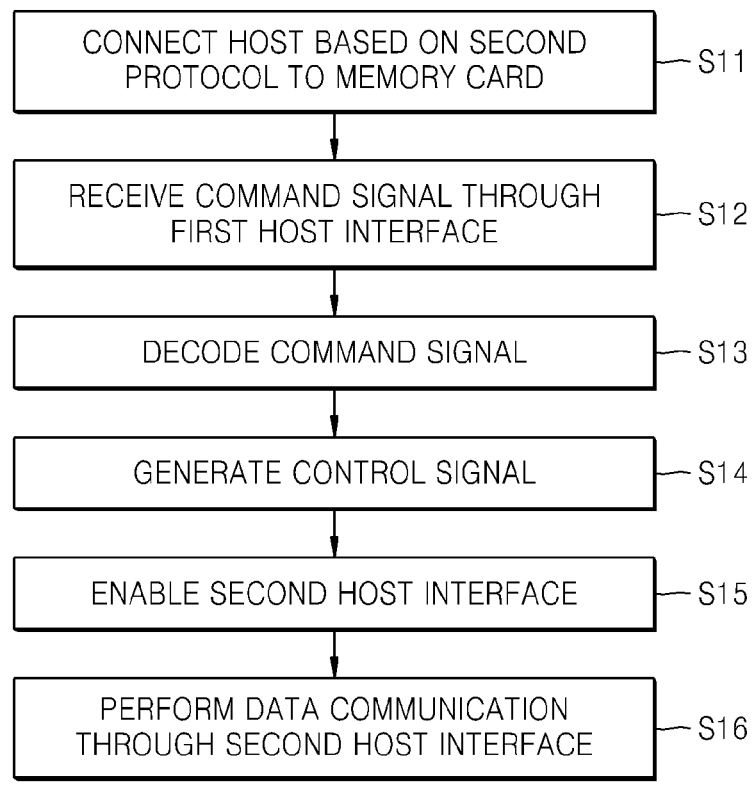
FIG. 6 is a flowchart of a data communication method for a memory card according to an exemplary embodiment of the present invention.

FIG. 6 is a flowchart summarizing a data communication method for a memory card according to an embodiment of the invention. Referring to FIG. 6, a host providing a voluminous data file is connected to the memory card (S11). The host may be a device serially transmitting data at high speed using a second protocol. The memory card is assumed to include a first host interface operating on the basis of a first protocol, as well as a second host interface operating on the basis of the second protocol.

Once the host is connected to the memory card, the enablement of the second host interface is controlled by a control signal resulting from a command received from the host via the first host interface. For example, a command signal is received via the first host interface (S12), is decoded by a competent memory controller (S13) in order to generate a control signal (S14). The control signal is then applied through the memory card data bus to a circuit or means for enabling the second host interface (S15). Once the second host interface is enabled, the memory card and host are able to communicate data at high-speed using a protocol designed to facilitate the high-speed data transfers (S16).

Figure 7:
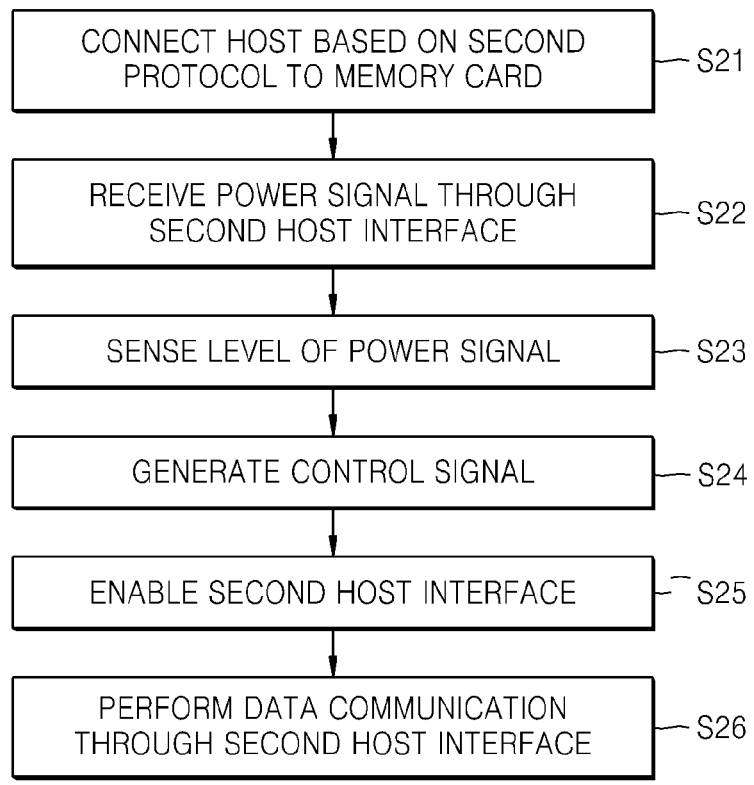
FIG. 7 is a flowchart of a data communication method for a memory card according to another exemplary embodiment of the present invention.

FIG. 7 is a flowchart summarizing a data communication method for a memory card according to another embodiment of the invention. Referring to FIG. 7, a host providing a voluminous data file is connected to the memory card (S21). Again, the host may be a device serially transmitting data at high speed using a defined (second) protocol, as compared with a first protocol controlling normal or general operations run a relatively lower speed. The memory card is again assumed to include a first host interface operating on the basis of the first protocol, as well as a second host interface operating on the basis of the second protocol.

Once the host is connected to the memory card, the enablement of the second host interface is controlled in relation to a received power signal communicated via a communication port associated with the second host interface. For example, a power signal is received via the second host interface (S22), is sensed by a competent power sensing circuit (S23) which generates a corresponding control signal (S24). The control signal is then applied to a circuit or means for enabling the second host interface (S25). Once the second host interface is enabled, the memory card and host are able to communicate data at high-speed using a protocol designed to facilitate the high-speed data transfers (S26).

As described above, in relation to the foregoing embodiments of the invention, selectively enabling a separate host interface directed to high-speed data communication only in response to a defined set of host commands allows a judicious conservation of battery power in a mobile device incorporating a memory card. The defined set of host command may vary in their make-up, but will generally indicate the host's intention to execute a high-speed operation, such as the transmission or reception of a voluminous data file.

While the present invention has been particularly shown and described with reference to exemplary embodiments thereof, it will be understood by those of ordinary skill in the art that various changes in form and detail may be made therein without departing from the scope of the invention as defined by the following claims.

What is claimed is:

1. A memory card comprising:
   a first communication port facilitating connection between a host and a first host interface, the first host interface facilitating communication of data between the memory card and a host using a first protocol;
   a second communication port, connected to a second host interface through a plurality of conductive lines, facilitating connection between the host and the second host interface, the second host interface facilitating communication of data between the memory card and the host using a second protocol;

a memory unit storing data;

a power sensing unit, connected to a predetermined conductive line of the plurality of conductive lines positioned between the second communication port and the second host interface, sensing application of a power signal to the second host interface via the second communication port and generating a control signal in response to the sensed power signal; and an enable control unit selectively enabling operation of the second host interface in response to the control signal, when the power signal is sensed.

2. The memory card of claim 1, further comprising a data bus connecting the first and second host interfaces, the memory controller, and the enable control unit.

3. The memory card of claim 2, wherein the enable control unit comprises a switch connecting application of a power signal to the second host interface.

4. The memory card of claim 2, wherein the first communication port and the second communication port are disposed on a common face of the memory card.

5. The memory card of claim 1, wherein each one of the first communication port and second communication port comprises at least one pin respectively providing electrical contact between the first and second host interfaces and the host.

6. The memory card of claim 5, wherein the second communication port is disposed electrically proximate the memory controller.

7. The memory card of claim 1, wherein the second host interface and the second protocol facilitate high-speed serial data communication between the host and the memory card.

* * * * *